United States Patent [19]

Kimura

[11] Patent Number: 4,764,751

[45] Date of Patent: Aug. 16, 1988

[54] METHOD OF NONLINEAR A/D CONVERSION

[75] Inventor: Hideaki Kimura, Kanagawa, Japan

[73] Assignee: Fuji Photo Film Co., Ltd., Kanagawa, Japan

[21] Appl. No.: 12,406

[22] Filed: Feb. 9, 1987

[30] Foreign Application Priority Data

Feb. 7, 1986 [JP] Japan ................................. 61-25552

[51] Int. Cl.[4] ............................................. H03M 1/58
[52] U.S. Cl. ...................... 340/347 AD; 340/347 CC; 340/347 NT
[58] Field of Search ................. 340/347 AD, 347 CC, 340/347 NT

[56] References Cited

U.S. PATENT DOCUMENTS

| | | | |
|---|---|---|---|
| 4,031,530 | 6/1977 | Aneshansley | 340/347 NT |
| 4,364,027 | 12/1982 | Murooka | 340/347 CC |
| 4,367,457 | 1/1983 | Tadauchi et al. | 340/347 AD |

Primary Examiner—William M. Shoop, Jr.
Assistant Examiner—Richard K. Blum
Attorney, Agent, or Firm—Sughrue, Mion, Zinn, Macpeak, and Seas

[57] ABSTRACT

A non-linear analog-to-digital converter in which an output of a non-linear analog-to-digital conversion circuit is applied to a look-up table memory. The contents of the look-up table are adjusted to compensate for variance in the conversion circuit or to provide a different conversion.

8 Claims, 5 Drawing Sheets

METHOD OF NONLINEAR A/D CONVERSION

BACKGROUND OF THE INVENTION

1. Field of the Invention

The present invention relates to a method of converting an electric analog signal into digital signals by using a non-linear A/D converter.

2. Background of the Invention

Various methods of converting an analog signal into digital signals have been put into practical use. In an image signal processing system, the original image on paper, a microfilm or the like is scanned by laser light, and the reflected or transmitted laser light is photoelectrically converted into an image signal. The analog image signal is subjected to A/D conversion to generate digital image signals which are subjected to gradation compensation, edge emphasis or other digital processing. In such image signal processing, it is always necessary to convert the analog image signal into digital image signals having digital values reflecting the density of the original image in order to make a sharp and clear reproduced image with fidelity to the original image. However, if the digital signals converted from the analog image signal have been digitized with too few bits, then in the digital electric processing, the continuously changing density of the original image is represented by a discontinuously changing density of the reproduced image due to the quantization error so that the quality of the reproduced image conspicuously deteriorates. For that reason, the A/D conversion needs to be performed with sufficiently fine digitization intervals. Since the density interval which can be perceived by human eyes differs between the light and the dark side, the deterioration of the quality of the reproduced image due to the discontinuity of the density can be minimized if the A/D conversion is performed with a minimum necessary number of bits depending on this difference. Examples of functions for representing the human visual characteristic are mentioned below:

CIE 1976: $L^* = 116 (Y/Y_o)^{\frac{1}{3}} - 16$

Bartleson: $L^{**} = 11.15 (100Y/Y_o)^{\frac{1}{3}} - 16$

The A/D conversion can be performed with N bit digitization over a density range from the maximum density $D_{max}$ to the minimum density $D_{min}$ on the basis of the relation between the above-mentioned function and the density so that the change $\Delta L^*$ in the human visual characteristic with regard to the digitization interval is constant $[(L^*_{max} - L^*_{min})/(2^N - 1)]$. This variable quantization is ideal and the deterioration of the quality of the reproduced image can be avoided.

Figure 1:
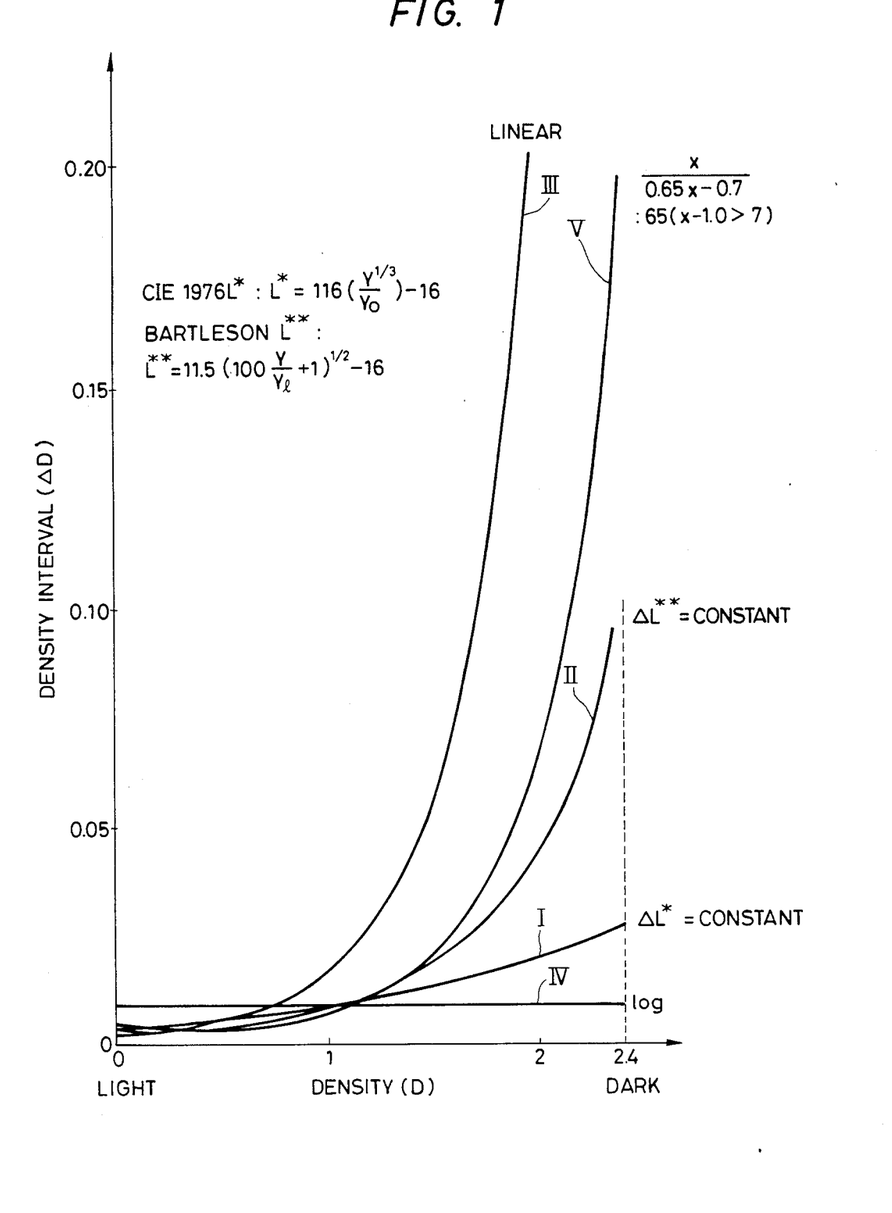
FIG. 1 shows curves indicating the relation between density and density interval to explain an A/D conversion method provided according to the present invention, and conventional A/D conversion methods.

FIG. 1 shows curves each indicating the relation between the density D of a reproduced image and the density interval $\Delta D$ with eight bit digitization. The density D is shown along the abscissa and the density interval $\Delta D$ is shown along the ordinate in FIG. 1. Curves I and II indicate ideal cases of $\Delta L^*$ and $\Delta L^{**}$ respectively being held constant. For the ideal cases, the density range of between 0 and 2.4 is illustrated.

Usually, the density is subjected to near A/D conversion (with digitization of eight bits, for example). Curve III indicates the relation between the density and the density interval in the linear A/D conversion. It is understood from the ideal curves I and II and the linear curve III that the density can be finely divided at its lower portion (light side) but is roughly divided at its higher portion (dark side). Therefore, the density interval becomes larger at the higher end of the density due to the human visual characteristic.

Since the human visual characteristic is often considered to be logarithmic, the A/D conversion is thus performed in some cases after logarithmic conversion. Curve IV indicates the relation between the density and the density interval in the logarithmic conversion over the same density range. It is understood from the logarithmic curve IV that it is nearer to the ideal curves I and II. However, this density is divided at its higher end more finely than the actual resolving power of the human eye so as to make the density appear to be smoothly changing, but the discontinuity of the density looks conspicuous at its lower end.

Figure 2A:
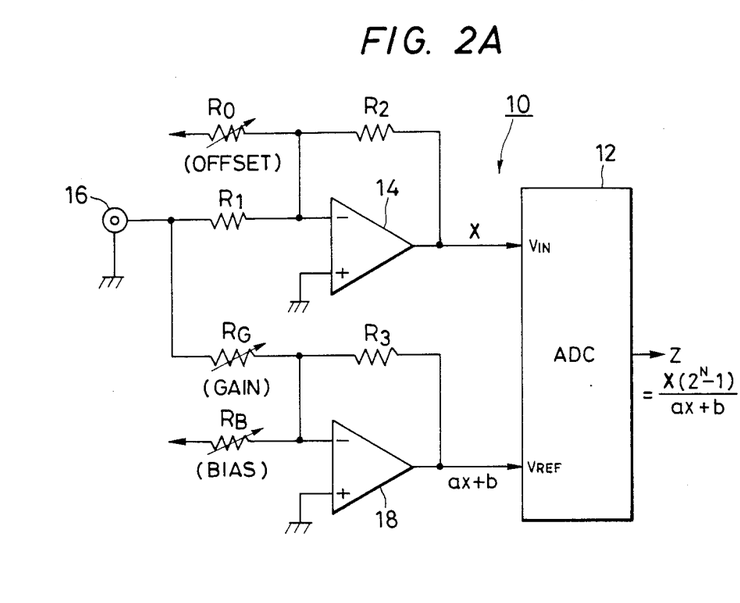
FIG. 2A shows a block diagram of a nonlinear A/D converter which is used in the A/D conversion method provided according to the present invention, and the conventional A/D conversion methods.
Figure 2B:
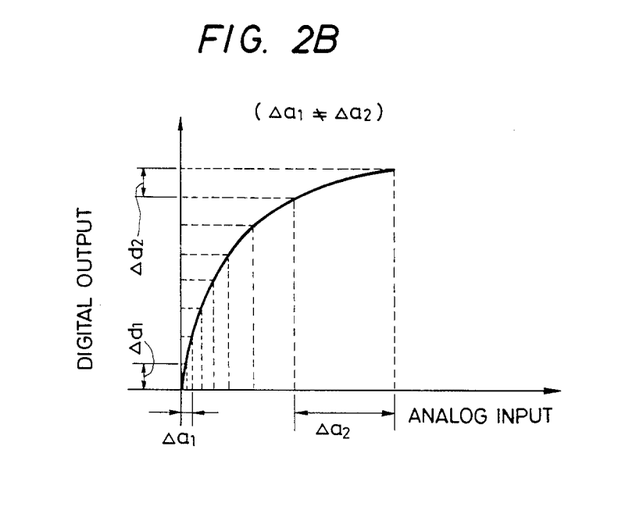
FIG. 2B is a drawing for explaining the nonlinear A/D conversion characteristic of the converter.

Although it is impossible that the human visual characteristics $L^*$ and $L^{**}$ indicated by the ideal curves I and II are attained through the use of an electric circuit, an approximation to the characteristics can be expected to be performed to provide an improved characteristic to enhance the quality of a reproduced image. For the approximation, the use of an A/D converter having a non-linear conversion characteristic has been conventionally tried. The nonlinear A/D converter is now briefly described with reference to FIGS. 2A and 2B. FIG. 2A shows the basic circuit constitution of the conventional nonlinear A/D converter 10. A converting section (ADC) 12 converts an input analog signal into output digital signals. The output terminal of a first amplifier 14 is connected to the signal input terminal $V_{IN}$ of the converting section 12. The negative terminal of the first amplifier 14 is connected to an image signal input terminal 16 through a resistor $R_1$, and the positive terminal of the first amplifier is grounded. A feedback resistor $R_2$ is connected between the negative terminal and output terminal of the first amplifier 14. The negative terminal of the first amplifier 14 is connected to a power supply through an offset adjustment resistor $R_O$. The output terminal of a second amplifier 18 is connected to the reference input terminal $V_{REF}$ of the converting section 12. The negative terminal of the second amplifier 18 is connected to the image signal input terminal 16 through a gain adjustment resistor $R_G$ and is also connected to the power supply through a bias adjustment resistor $R_B$. A feedback resistor $R_3$ connects the output terminal and the negative input terminal of the second amplifier 18. The positive terminal of the second amplifier 18 is grounded. The conversion output signal z of the nonlinear A/D converter 10 an be expressed as $$z = (2^N - 1) \times /(ax + b)$$

where x denotes an input image signal, $ax + b$ denotes a reference signal, N denotes the number of bits in digitization, a coefficient a is determined by the gain, and another coefficient b is determined by the bias.

If N is given as a value of 8, the above equation becomes $$z = 255 \times /(ax + b)$$

Therefore, $z = 0$ results from $x = 0$. If $x = ax + b$ is given i.e. $x = b/(1-a)$, $z = 255$ results. If a and b are approximately determined, digital outputs $\Delta d_1$ and $\Delta d_2$ ($\Delta d_1 = \Delta d_2$) can be obtained for analog inputs $\Delta a_1$ and $\Delta a_2$ ($\Delta a_1 \neq \Delta a_2$), thus enabling equal division, as shown in FIG. 2B which indicates the conversion characteristic of the nonlinear A/D converter. The analog inputs to the converter 12 and the digital outputs therefrom are shown along the abscissa and the ordinate, respectively, in FIG. 2B. It is understood from FIG. 2B that the resolving power for the digital output from the nonlinear A/D converter can be altered depending on the level of the analog input.

When the nonlinear A/D converter 10 having the above-described conversion characteristic is provided in an image signal processor, the visual discontinuity of a reproduced image, which has been a problem in the conventional art, can be reduced to make the density or gradation of the image look to be naturally changing to human eyes.

However, when the nonlinear A/D converter is used, the nonlinear conversion characteristic is affected by the irregularities of the components of the image signal processor so that the conversion characteristic varies from processor to processor. For that reason, there is a problem that reproduced images of the same density cannot be obtained when the identical original image is read by different processors.

SUMMARY OF THE INVENTION

Accordingly, it is an object of the present invention to provide a nonlinear A/D conversion method in which reproduced images of the same density are obtained even if the identical original image is read by different image signal processors.

In the nonlinear A/D conversion method provided according to the present invention, an electric input analog signal whose level changes is converted into digital signals by a nonlinear A/D converter. In that case, conversion characteristic data on the nonlinear A/D converter are measured first. Digital values compensated on the basis of previously obtained reference data and corresponding to the level of the electric input analog signal are obtained in terms of the measured conversion characteristic data and then stored in a look-up table memory. The stored digital values are used as the digital signals corresponding to the analog signal actually inputted.

DETAILED DESCRIPTION OF THE PREFERRED EMBODIMENTS

In a preferred embodiment of the present invention, the measured conversion characteristic data are used as data in conversion from a linear characteristic to a nonlinear characteristic. The previously obtained reference data are used as values in conversion from the linear characteristic to a logarithmic characteristic. Also the digital values are used as values in conversion from the nonlinear characteristic to the logarithmic characteristic.

It is preferable in embodying the present invention that the electric input analog signal is an image signal obtained by reading the original image on paper, a film or the like.

The conversion characteristic of the nonlinear A/D converter is measured for each image signal processor in which the converter is provided. The irregularities of the components of the processor and its characteristics are thus compensated so that the digital output signals having the proper digital values are generated correspondingly to the electric input analog signal.

An embodiment of the present invention, which uses a nonlinear A/D conversion method, is hereafter described with reference to the drawings.

Figure 3:
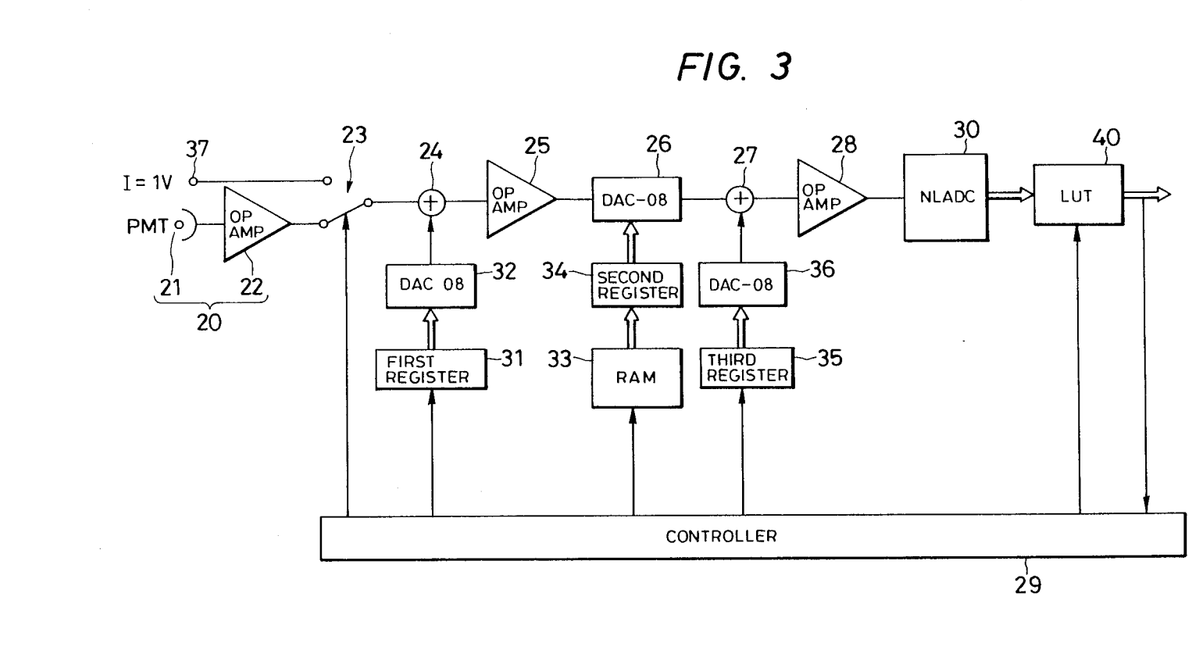
FIG. 3 shows a block diagram of the main part of an image signal processor to which the nonlinear A/D conversion method provided according to the present invention is applied.

FIG. 3 shows a block diagram of an example of the main part of an image signal processor to which the nonlinear A/D conversion method is applied. The main part is a circuit in which an analog image signal obtained by reading the original image on paper, a film or the like is subjected to nonlinear A/D conversion to generate a digital signal which is sent out from the circuit to a line memory (not shown in the drawings) for image signal processing or to another processing circuit.

FIG. 3 shows an input section 20 for reading the original image to generate the analog image signal which is an electric input analog signal. The input section 20 includes a photomultiplier (PMT) 21 and an operational amplifier 22 (OP AMP). A nonlinear A/D converter (NL A/D CONV.) 30 performs the A/D conversion of the input image signal x to generate a provisional digital signal z. Compensated digital values z' corresponding to the provisional digital signals z are stored in a look-up table memory (LUT) 40. The compensated digital value z' corresponding to the provisional digital signal is read as a converted digital signal out of the look-up table memory 40 and sent out to a next section.

Various electric components are provided between the input section 20 and the converter 30 which are necessary to adjust the offset and gain of the input analog signal in measuring the conversion characteristics data on the nonlinear A/D converter 30 and actually processing the signal. The electric components include a switch 23, a first synthesis circuit 24, a first operational amplifier 25, a first multiplying D/A converter 26, a second synthesis circuit 27 and a second operational amplifier 28 which are connected in series with each other between the input section 20 and the nonlinear A/D converter 30.

A controller 29 regulates the whole circuit shown in FIG. 3. The controller 29 includes a CPU and other necessary control circuits which are not specifically shown in FIG. 3.

The first synthesis circuit 24 functions so that an offset signal for adjusting the offset of the input image signal, which is produced by the combination of the input section 20, the first operational amplifier 25 and the first multiplying D/A converter 26, is applied (added) to the image signal. A signal from a first register 31 is supplied as the offset signal through a second multiplying D/A converter 32 in accordance with a command from the controller 29.

The first multiplying D/A converter 26 functions so as to adjust the gain of the input image signal. In order to adjust the gain, a gain value stored in a RAM 33 is read out of it and supplied to the first multiplying D/A converter 26 through a second register 34, in accordance with a command from the controller 29.

The second synthesis circuit 27 functions so that an offset produced by the operational amplifier 28 and the nonlinear A/D converter 30 is adjusted. In order to adjust the offset, a signal from a third register 35 is supplied as an offset signal through a third multiplying D/A converter 36 in accordance with a command from the controller 29, in the same manner as the above-mentioned adjustment of the preceding offset.

The switch 23 functions so that the input image signal from the input section 20 and an input signal having a prescribed constant value and supplied from a terminal 37 at the time of the measurement of a characteristic are changed over from one to the other in accordance with a command from the controller 29.

The output z of the nonlinear A/D converter 39 or the output z' of the look-up table memory 40 can be entered into the CPU of the controller 29. Data can be stored in the look-up table memory 40 from the CPU. The multiplying D/A converters 26, 32 and 36 are also denoted by DAC-08 in FIG. 3.

Figure 4:
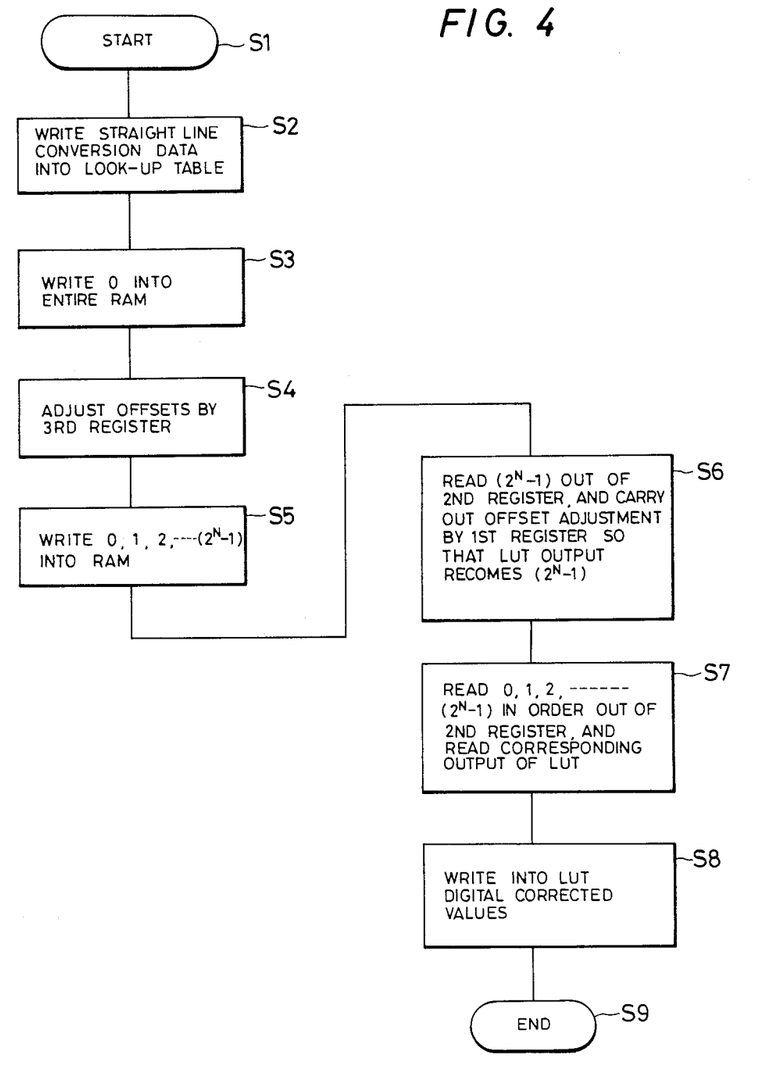
FIG. 4 shows a flow chart of operation steps for embodying the present invention.
Figure 5A:
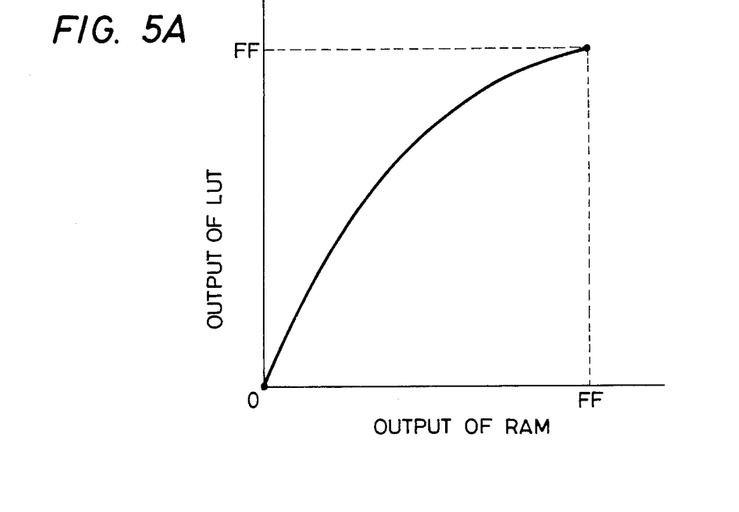
FIGS. 5A and 5B show characteristic curves for explaining conversion characteristics for describing the present invention.
Figure 5B:
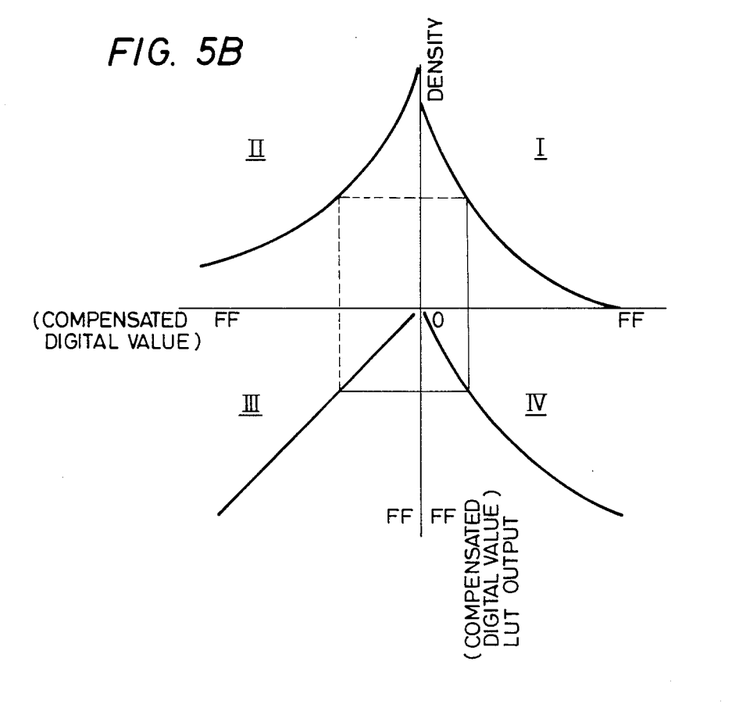

The nonlinear A/D conversion method is now described with reference to FIGS. 3, 4 and 5. FIG. 4 shows a flow chart of operational steps of the method FIG. 5 shows a characteristic curve for explaining a conversion characteristic used for describing the present invention.

The measurement of conversion characteristic data on the non-linear A/D converter is first described with regard to a case of digitization with eight bits (N=8). The circuit shown in FIG. 3 is put in operation in step S1. At that time, although it is not always necessary, the switch 23 is shifted to a terminal for a prescribed input signal I or IV in accordance with a command from the controller 29. The output x of the first multiplying D/A converter 26 is expressed as $x = D \cdot I/(2^N-1) = D \cdot I/255$ where D denotes a gain from the RAM 33. Conversion data falling on a straight line with an inclination of 45° are written from the CPU of the controller 29 into the look-up table memory 40 in a step S2. This means that the output of the nonlinear A/D converter 30 is outputted from the look-up table memory 40 while effecting no change thereto.

In step S3, values, all of which are set to zero, are written into the RAM 33 in accordance with a command from the controller 29. These zero values are supplied to the D/A converter 26 through the second register 34 to zero the output x of the converter 26.

The step S4, the offsets of the operational amplifier 28 and the nonlinear A/D converter 30 are adjusted by the use of the third register 35 in accordance with a command from the controller 29. The command makes the magnitude of the output $z = 255 \times /(ax+b)$ of the nonlinear A/D converter 30 and that of the output of the look-up table memory 40 zero so as to fix the offset values. In this case, a and b are supposed to be optionally adjusted values except for zero. A conversion characteristic data curve is plotted in FIG. 5 showing the output of the RAM along the axis of abscissa and that of the nonlinear A/D converter 30 or that of the look-up table memory 40 along the axis of ordinate. As a result of the adjustment of the offsets, the start point of the conversion characteristic data curve can be set at the origin (0, 0).

In step S5, N-bit data (which are 8-bit data in this case), namely 0, 1, 2, 3, ... and 255 are written into the RAM 33. If the swtich 23 is not already shifted to the reference terminal 37, the switch is shifted thereto.

In accordance with a command from the controller 29, the maximum data value $(2^N-1)$ (which is 255 in this case) in the RAM 33 is readout of the second register 34. At this time, the offset value of the first register 31 is determined and then fixed so that the output of the lookup table memory 40 becomes a correponding value $(2^N-1)$, which is 255 in this case. The $FF_H$, i.e. 255, value of the output of the RAM 33 and that of the output of the look-up table memory 40 are thus made to coincide with each other at the upper end point of the conversion characteristic data curve shown in FIG. 5.

In order to measure the conversion characteristic of the non-linear A/D converter 30, in step S7, the data 0, 1, 2, 3, ..., $(2^N-1)$, ... and 255 written in the RAM 33 are sequentially read out of the second register 34 in accordance with a command from the controller 29 which has the effect of reading the corresponding output produced on the look-up table memory 40.

With the series of operations as described above, the conversion characteristic of the nonlinear A/D converter 30 is obtained as shown in FIG. 5A. The characteristic data include the irregularities of the components of the image signal processor and its inherent characteristics.

The digital values from zero (0) to FF on the axis of abscissa in FIG. 5A correspond linearly to levels of electric input analog signal which is indicative of the amount of light received after having passed through the film or having been reflected on the paper or the like. While the levels of the input signal and the corresponding digital values represent a linear characteristic, the corresponding outputs of the look-up table memory 40 are nonlinear due to the conversion characteristic of the nonlinear A/D converter 30. On the other hand, density values (or values proportional thereto) having a logarithmic characteristics with respect to the input signal have previously been written in the memory (not shown) of the CPU of the controller 29. The density values can be obtained by subjecting the input signal to logarithmic conversion. The relation of the digital values corresponding to the input signal and the density values is indicated by the curve in the region I of FIG. 5B. For the purpose of explanation, the curve of FIG. 5A is depicted symmetrically with respect to the axis of abscissa in the region IV of FIG. 5B.

In step S8, compensated digital values corresponding to the level of the input signal are calculated in terms of the reference data and the conversion characteristic data in the memory of the controller 29, and then stored in the look-up tabale memory 40. More specifically, referring to the curve shown in region IV of FIG. 5B, the digital values on the axis of lower side ordinate corresponding respectively to the consecutive digital values on the axis of right side abscissa are nonconsecutive numbers. With this nonconsecutive digital values, new consecutive digital values from zero (0) to FF which are referred to as compensated digital values are made to be in one-to-one correspondence. The curve in the region II of FIG. 5B is drawn to indicate the density level for the respective compensated digital values. The data on this curve are stored in the look-up table memory 40. The operation is thus completed in a step S9. Since the measured conversion characteristic data are data in the conversion from the linear characteristic to the nonlinear characteristic and the reference data are the value in the conversion from the linear characterisic to the logarithmic characteristic, values in digital conversion from the nonlinear characteristic to the logarithmic characteristic can be easily calculated in terms of the conversion characteristic data and the reference data.

The CPU of the controller 29 includes a read/write circuit (not shown in the drawings) for reading in the output of the look-up table memory 40 and writing the read output into the look-up table memory 40 in order to perform the offset adjustment for the start and end points of the above-mentioned conversion characteristic data curve. The read/write circuit can be easily manufactured by conventional electronic circuit techniques.

The CPU of the controller 29 also includes a means (not shown in the drawings) for calculating values in conversion from the nonlinear characteristic to the linear characteristic, and a means (not shown in the drawings) for calculating the values in the conversion from the linear characteristic to the logarithmic characteristic, in order to perform conversion from the nonlinear characteristic to the logarithmic characteristic.

If the input signal is an image signal generated by reading an original image of changing density, the digital values stored in the look-up table memory 40 are compensated digital values which are density values exactly corresponding to the change in the density of the image. In that case, because of the conversion characteristic or the nonlinear A/D converter, the relation between the density and the density interval has a characteristic shown by the curve V in FIG. 1 and is similar to the ideal characteristic shown by the curve II which indicates the case of $\Delta L^{**}$ being held constant. Although the coefficients a and b are set at 0.65 and $-0.7$ respectively and a condition of $0 \geq x \geq -2$ is set for the curve V, the values for a, b and x are not confined to these conditions It is understood from the curve V that the visual characteristic is improved especially at the lower portion of the density, and the discontinuity of gradation at the lower portion of the density is thus reduced so as to make the reproduced image look with substantially continuous gradation to human eyes.

In order to actually read the original image, the switch 23 is first shifted to the input section 20 to read an ordinary white reference plate and an ordinary black reference plate to calibrate the image signal processor, as in the prior art. After that, the reading of the original image is started. According to the present invention, digital density values corresponding to the analog values of the read image signal are sequentially read out of the look-up table memory 40 and sent out as digital signals to the next section.

The present invention is not confined to the above-described embodiment, but can be applied to aural signal processing as well.

It is obvious that a circuit constitution different from that adopted in the above-described embodiment may also be adopted to embody the present invention.

In the nonlinear A/D conversion method provided according to the present invention, a nonlinear conversion characteristic can be made similar to an ideal visual conversion characteristic or the like, as described above, so that a reproduced image or the like is perceived as having a continuously changing distribution of density. Even if the non-linear A/D conversion characteristic has an irregularity, the irregularity is automatically compensated to enable image processing with good reproduced gradation without being affected by the characteristic of the image signal processor or the like.

What is claimed is:

1. A method for A/D conversion comprising the steps of:
   subjecting a varying level analog signal to a non-linear analog-to-digital conversion in a converter to produce a provisional digital signal;
   measuring conversion characteristic data of said converter for a plurality of analog input signals of known values;
   compensating said conversion characteristic data according to predetermined reference data corresponding to said plurality of analog input signals;
   storing said compensated conversion characteristic data in a look-up table memory; and
   accessing said look-up table memory according to said provisional digital signal.

2. A method as recited in claim 1, further comprising reading an original image to provide an image signal as said varying level analog signal.

3. A method as recited in claim 1:
   wherein said conversion characteristic data are data for converting from a linear characteristic to a nonlinear characteristic;
   wherein said reference data are data for converting from the linear characteristic to a logarithmic characteristic; and
   wherein said compensated conversion characteristic data are data for converting from the nonlinear characteristic to the logarithmic characteristic.

4. A method as recited in claim 2:
   wherein said conversion characteristic data are data for converting from a linear characteristic to a nonlinear characteristic;
   wherein said reference data are data for converting from the linear characteristic to a logarithmic characteristic; and
   wherein said compensated conversion characteristic data are data for converting from the nonlinear characteristic to the logarithmic characteristic.

5. A method as recited in claim 1, wherein said measuring step comprises:
   storing a linear function in said look-up table memory:
   subjecting said plurality of analog input signals to said non-linear analog-to-digital conversion in said converter to produce calibrating digital signals; and
   accessing said look-up table-memory stored with said linear function according to said calibrating digital signals.

6. A non-linear analog-to-digital converter comprising:
   a non-linear analog-to-digital conversion circuit receiving an analog input signal;
   a look-up table memory receiving an output of said conversion circuit and producing a digital output of said converter;
   means for providing predetermined analog values to said conversion circuit; and
   means responsive to said digital output for said predetermined analog value for storing values in said look-up table memory.

7. A converter as recited in claim 6, wherein said storing means calculates said values according to a conversion between said predetermined analog values and said digital output for said predetermined analog values and according to a predetermined conversion between said predetermined analog values and logarithmetic values corresponding to said predetermined analog values.

8. A converter as recited in claim 1, further comprising:
 means for adjusting said input signal to said conversion circuit to be a maximum value; and
 means for adjusting said input signal to said conversion circuit to be a minimum value.

* * * * *